United States Patent
Park

(10) Patent No.: US 7,425,494 B2
(45) Date of Patent: Sep. 16, 2008

(54) METHOD FOR FORMING VOID-FREE TRENCH ISOLATION LAYER

(75) Inventor: Kyung Min Park, Incheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 88 days.

(21) Appl. No.: 11/504,560

(22) Filed: Aug. 14, 2006

(65) Prior Publication Data
US 2007/0037361 A1    Feb. 15, 2007

(30) Foreign Application Priority Data
Aug. 12, 2005    (KR) .............. 10-2005-0074214

(51) Int. Cl.
*H01L 21/76* (2006.01)
(52) U.S. Cl. .............. 438/424; 257/E21.545; 257/E21.628
(58) Field of Classification Search .......... 438/424, 438/435, 680, 221, 296, 359, 425
See application file for complete search history.

(56) References Cited

U.S. PATENT DOCUMENTS

| 6,914,316 | B2* | 7/2005 | Yun et al. ............. 257/506 |
| 6,989,337 | B2* | 1/2006 | Chu et al. ............. 438/788 |

* cited by examiner

*Primary Examiner*—Quoc D Hoang
(74) *Attorney, Agent, or Firm*—Andrew D. Fortney

(57) ABSTRACT

Disclosed method for forming void-free isolation comprises the steps of: forming a trench in an isolation region in a semiconductor substrate; and forming a filling oxide on the semiconductor substrate to fill the trench. The filling oxide is formed by HDP-CVD process and by using reactant gas mixture that includes $O_2$, $SiH_4$ and He. In an embodiment of the present invention, the formation of the filling oxide is carried out in two-step process which includes: first filling the trench with the filling oxide under the first processing condition that a first D/S value has a greater deposition rate than sputter etching rate; and second filling the trench with the filling oxide under the second processing condition that a second D/S value is smaller than the first D/S value. Here the D/S value is defined as "(net deposition rate+blanket sputter etching rate)/(blanket sputter etching rate)".

19 Claims, 8 Drawing Sheets

FIG.5

AT D1 STEP

| D/R(A/min)(SiH4) | S/R(A/min)(bias) | D/S |
|---|---|---|
| 2590 (22/6.3) | 97 (1250W) | 27.7 |
| 2884 (25/7) | | 30.7 |
| 3165 (28/7.7) | | 33.6 |
| 2590 (22/6.3) | 154 (1500W) | 17.8 |
| 2884 (25/7) | | 19.7 |
| 3165 (28/7.7) | | 20.6 |
| 2590 (22/6.3) | 217 (1650W) | 12.9 |
| 2884 (25/7) | | 14.2 |
| 3165 (28/7.7) | | 15.6 |

AT D2 STEP

| D/R(A/min)(SiH4) | S/R(A/min)(bias) | D/S |
|---|---|---|
| 2454 (22/6.3) | 352 (2250W) | 7.9 |
| 2759 (25/7) | | 8.8 |
| 3061 (28/7.7) | | 9.8 |
| 2454 (22/6.3) | 431 (1500W) | 6.6 |
| 2759 (25/7) | | 7.4 |
| 3061 (28/7.7) | | 8.1 |
| 2454 (22/6.3) | 502 (1650W) | 5.9 |
| 2759 (25/7) | | 6.1 |
| 3061 (28/7.7) | | 7.5 |

METHOD FOR FORMING VOID-FREE TRENCH ISOLATION LAYER

BACKGROUND OF THE INVENTION

1. Technical Field

The present invention relates to isolation technologies for semiconductor integrated circuit devices. More particularly, the present invention relates to a method for forming void-free trench isolation layer by using He gas in high density plasma chemical vapor deposition (HDP-CVD) equipment.

2. Description of Related Arts

Shallow trench isolation (STI) is one of the most widely used technologies for insulating or isolating individual elements in semiconductor integrated circuits. The isolation region or layer formed by the STI occupies smaller area while providing good isolation quality and is thus suitable for higher integration of the IC devices.

As the degree of integration increases, it is beneficial to form a void-free isolation layer filled with oxide material in a shallow trench having higher aspect ratio equal to or greater than 3.

Voids may occur in STI processes due to a lack of process margin, which results in yield losses, such as scrapping of lots of wafers, and possibly a need to re-work the wafers. For solving this problem, other fabrication processes could be developed to secure enough process margin. However, known scheme(s) may be difficult and/or not cost effective. Therefore, it is desired to obtain broader margin by modifying the trench isolation process.

In the trench isolation formation process, HDP-CVD equipment is used to form an oxide film in the shallow trench. The oxide film is deposited by the combination of deposition and simultaneous sputtering of reaction gases in HDP-CVD system. Specifically, a gas mixture of $SiH_4$ and $O_2$ are ionized and/or converted to reactive species such as radicals by a high-density plasma source, and the ions and/or other reactive species form $SiO_x$. Here, $O_2$ contributes to the deposition of the oxide layer and at the same time contributes to sputtering by the bias power applied to the reaction chamber.

During the formation of the oxide film in the HDP-CVD equipment, the ratio of deposition and sputtering is denoted by 'D/S' ("deposition-to-sputter-etching ratio" or simply "sputter-etch ratio"), which is defined as "(net deposition rate+blanket sputtering rate)/(blanket sputtering rate)". The value of D/S can determine the gap-fill capability of HDP-CVD process. When D/S is large, the deposition rate is greater than the sputter etching rate, and the formation of oxide layer is largely depending on deposition rather than sputter etching by the reaction gases. In the mean time, a lower D/S indicates that sputter etching by the reaction gases dominates or plays a relatively important role in the formation of the oxide layer. Therefore, a lower D/S is advantageous for filling a trench having an aspect ratio of 3 or greater, because the sputter etching may prevent the trench hole from closing before complete gap-filling. However, if the ratio (D/S) is too small, trench patterns can be etched back or sputtered off. Therefore, it is significant to choose the proper value of D/S according to the processing conditions.

A conventional trench isolation is formed in HDP-CVD equipment using $SiH_4$ and $O_2$ for the oxide formation gases. However, when molecules having large atomic radius such as $O_2$ are used, the sputtered ions from the $O_2$ atoms collide with the reaction gases and may cause re-deposition of oxide at the sidewalls in upper corners of the trench. Thus, formation of oxide films without voids may be difficult when a trench having a width less than 150 nm is filled using $O_2$ gas. Further, trench isolation structures formed using $O_2$ have a greater difference in the wave height, and hence wafer defects in subsequent processes such as chemical mechanical polishing (CMP) process may be produced.

SUMMARY OF THE INVENTION

The purpose of the present invention is to form a trench isolation having a width of 130 nm without voids by using He gas in HDP-CVD equipment.

Another purpose of the present invention is to secure process margin for 130 nm (or smaller) devices in HDP-CVD process using He gas.

According to an aspect of the present invention, method for forming a trench isolation comprises the steps of: forming a trench in an isolation region in a semiconductor substrate; and filling the trench with an oxide. The filling oxide is formed by a HDP-CVD process using a reactant gas mixture that includes $O_2$, $SiH_4$ and He.

In an embodiment of the present invention, the formation of the filling oxide is carried out in two-step process which includes: first depositing the oxide into the trench under first processing conditions that result in a first D/S value having a greater oxide deposition rate than sputter etching rate; and second filling the trench with the oxide under second processing conditions that result in a second D/S value that is smaller than the first D/S value. Here the D/S value is defined as "(net deposition rate+blanket sputter etching rate)/(blanket sputter etching rate)". The deposition rate of the first D/S value and second D/S value may be controlled by the flow rate of $SiH_4$ (e.g., into a top surface or wall of the reaction/deposition chamber), and the rate of sputter etching may be controlled by a bias power. In one embodiment, the first D/S value is equal to or greater than 33.6.

BRIEF DESCRIPTION OF DRAWINGS

The above and other features and advantages of the present invention will become more apparent by describing in detail preferred embodiments thereof with reference to the attached drawings in which:

FIG. 5 is a table for illustrating D/S conditions according to D/R and S/R in a HDP-CVD trench filling process that employs He;

DETAILED DESCRIPTION OF THE INVENTION

Figure 1:
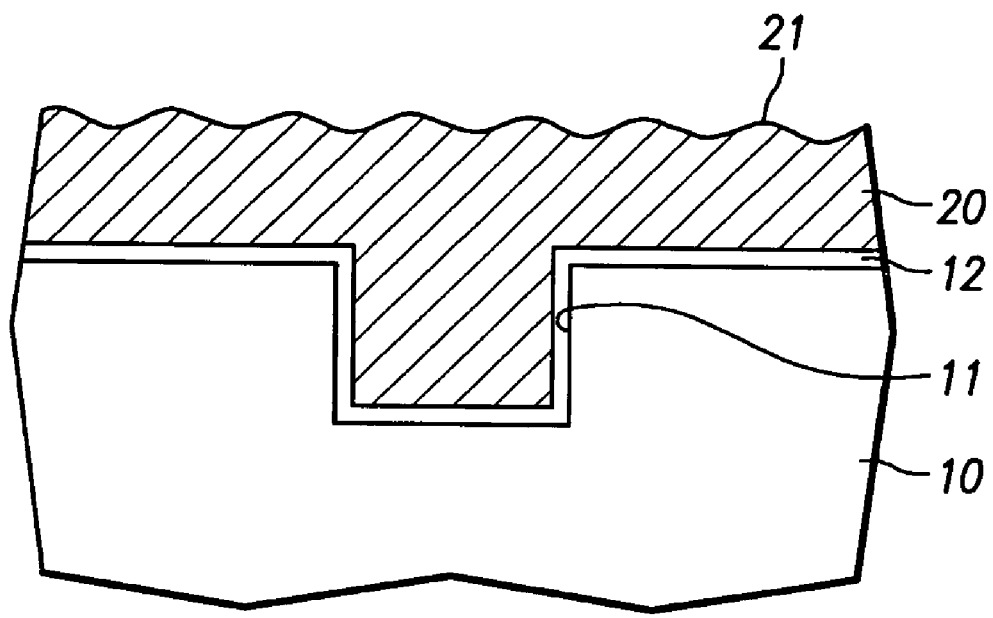
FIG. 1 shows a trench isolation formation method according to an embodiment of the present invention.

FIG. 1 illustrates the method for forming a trench isolation according to an embodiment of the present invention.

Referring to FIG. 1, a trench 11 is formed by a conventional photolithography process (e.g., photoresist deposition, patterning and development, followed by substrate etching and photoresist removal) in an isolation region of a silicon substrate 10.

Silicon nitride layer 12 is formed both within the trench 11 and on the overall surface of the substrate 10. The silicon nitride layer 12 may be formed by low pressure chemical vapor deposition (LPCVD), and the thickness thereof may be from 10 to 40 nm (e.g., in one embodiment, the SiN 12 thickness is approximately 20 nm). The purpose of depositing silicon nitride layer 12 is to reduce the width and depth of the trench 11. When the silicon nitride layer 12 is deposited, the trench 11 may have a width of about 50 nm to 250 nm (about 120 nm to 130 nm in a manufacturing process having 130 nm minimum design rules) and a depth of about 200 nm to 500 nm (about 360 nm to 370 nm in a manufacturing process having 130 nm minimum design rules).

Next, oxide 20 is formed or filled within the trench 11. HDP-CVD equipment may be used for depositing the oxide 20 in the trench 11 under one or more (preferably all) of the following conditions: the flow rate of deposition gas of $SiH_4$ introduced to the side of the chamber may be from 50 to 70 sccm (e.g., approximately 59 sccm), and the flow rate of $SiH_4$ introduced into the top of the chamber may be from 5 to 10 sccm (e.g., approximately 8.1 sccm). Further, the flow rates of $O_2$ and He that are introduced into the side of the chamber may be from 80 to 150 sccm (e.g., about 109 sccm) of $O_2$ and from 50 to 150 sccm (e.g., about 100 sccm) of He, respectively. In this embodiment, He (or other noble gas, such as Ne) having a smaller atomic radius than a molecular radius of $O_2$ is added (a difference from conventional art that employs only $O_2$ for sputter etching). Therefore, the potential of the plasma may be increased and the density of the plasma is improved (e.g., increased or decreased in a result-effective direction) to enhance the oxide filling of the trench (e.g., reduce the incidence of voids in the trenches). Further, when He functions as a sputter etching gas, the re-deposition of oxide on the sides of trench top surface (a so-called "overhang," "bread-loafing" or "pinch-off" effect), which is believed to be caused by the collision of ions or other reactive species from the He-containing plasma with the reactant gas, can be reduced, and the trench 11 can be filled with the oxide 20 without voids or with a reduced incidence of voids. From this, it is clear that the addition of He is advantageous for void-free trench filling with oxide, relative to the conventional art in which only $O_2$ is employed as a sputter etching gas.

Subsequently, formation of the trench isolation layer by HDP CVD is carried out under one or more (preferably all) of the following conditions. Vacuum pressure in the deposition/reaction chamber is from 0.5 to 10 mTorr (in one embodiment, about 3 mTorr) and the temperature of silicon substrate is about 600° C. to 900° C. (in one embodiment, about 700° C.). Bias power may be from 1800 W to 2500 W (in one embodiment, the bias power may vary from 1935 W to 2365 W, depending on the sub-step, phase or stage of the oxide deposition process) to control D/S, and a two-step process having varying D/S values may be carried out to form the trench isolation layer. In the first step (deposition 1, D1), the deposition rate is (significantly) greater than the sputter etching rate (higher D/S value is e.g., at least 33.6, also meaning that the ratio of the CVD deposition rate to the sputter etching rate is about 32.6 or higher), and the trench may be filled fast with the oxide before the generation of the overhang within the trench. In the second step (deposition 2, D2), D/S is lower than the first higher D/S value to complete the trench isolation layer while removing the overhang at the sidewalls of the trench hole. The deposition rate is determined by controlling the flow rate of $SiH_4$ reactant gas (e.g., $SiH_4$ introduced through the side of the chamber and/or $SiH_4$-introduced through the top of the chamber, preferably both), and the sputter etching rate is determined by controlling the bias power applied to the reaction chamber.

The thus formed trench isolation layer may have a smaller difference in the wave height 21 relative to a conventional process without He (e.g., using only dioxygen as a sputter etchant), and it is possible to reduce or prevent defects in the wafer which may occur in the subsequent chemical mechanical polishing (CMP) process (such as pits in the STI oxide resulting from exposing a void in the STI oxide).

Next, the gap filling results, features and capabilities of a conventional reactant gas mixture of $SiH_4$ and $O_2$ are compared to a reactant gas mixture of $SiH_4$, $O_2$ and He representative of the present invention.

Figure 2:
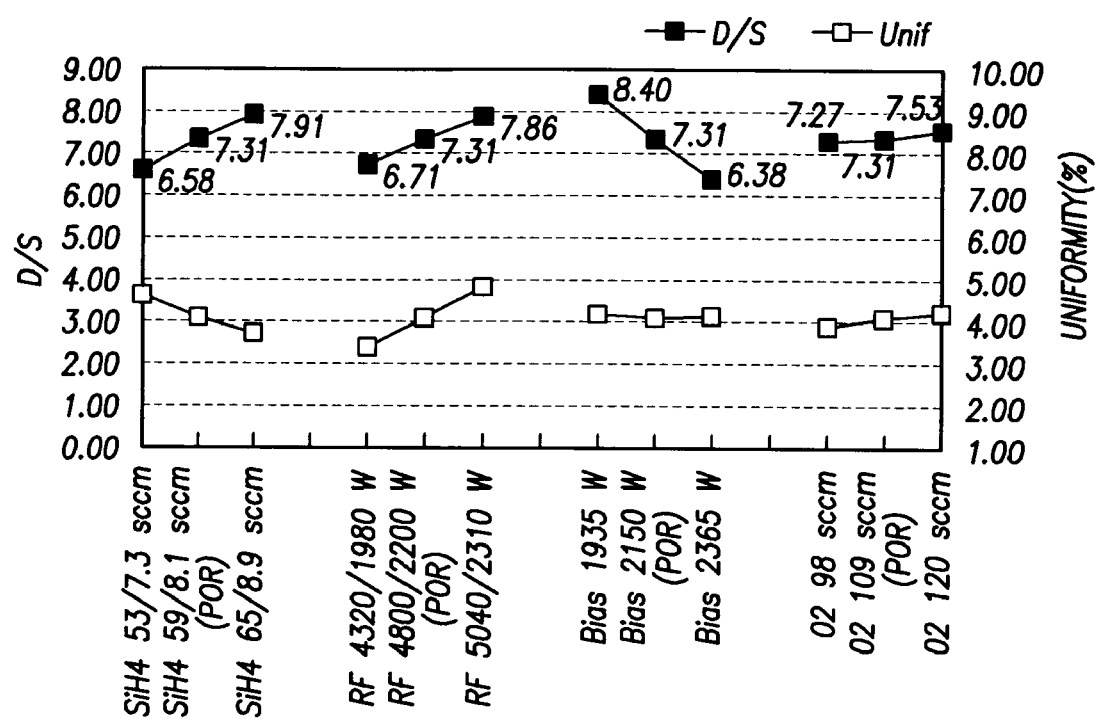
FIG. 2 is a graph for illustrating D/S under various conditions.

FIG. 2 shows D/S characteristics in various conditions when $SiH_4$ and $O_2$ are used for the reactant gas mixture. When parameters such as $SiH_4$ ratio, RF power, bias power and $O_2$ ratio are varied from the conventional process of recording (PoR), D/S and the uniformity of film thickness are observed. As shown in FIG. 2, D/S is mostly affected by the bias power. It can be explained that the variation of the bias power causes a variation in the ion density of accelerated $O_2$, the sputter etching rate and a relatively wide variation of D/S as a result-effecting parameter. Therefore, gap-filling results and features can be improved by making the bias power a variable parameter when using a gas mixture containing $SiH_4$ and $O_2$.

Figure 3:
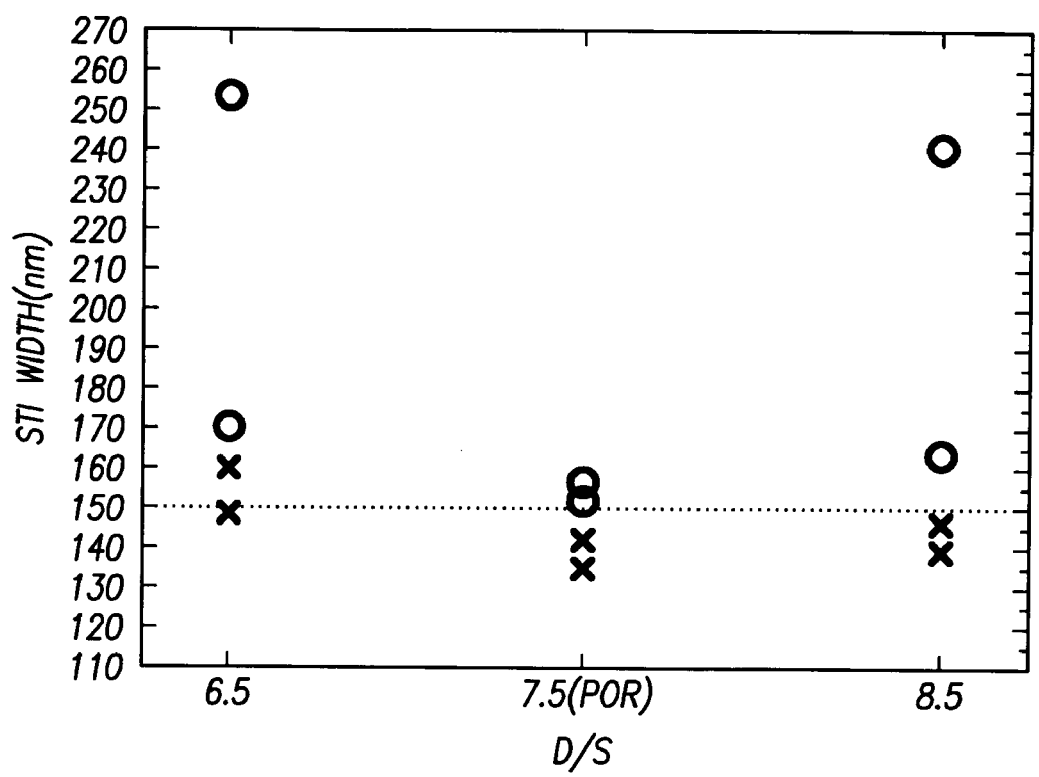
FIG. 3 is a graph for illustrating the trench filling ability according to D/S in a HDP-CVD process that employs $O_2$.

FIG. 3 illustrates the trench-filling capability when $SiH_4$ and $O_2$ are employed as the reactant gas mixture with varying bias power, and voids are observed in relatively narrow trenches (e.g., having a width of 150 nm or less) in a D/S range of 6.5 to 8.5. In FIG. 3, mark 'X' means "With Void", while mark "O" represents "No Void".

Figure 4:
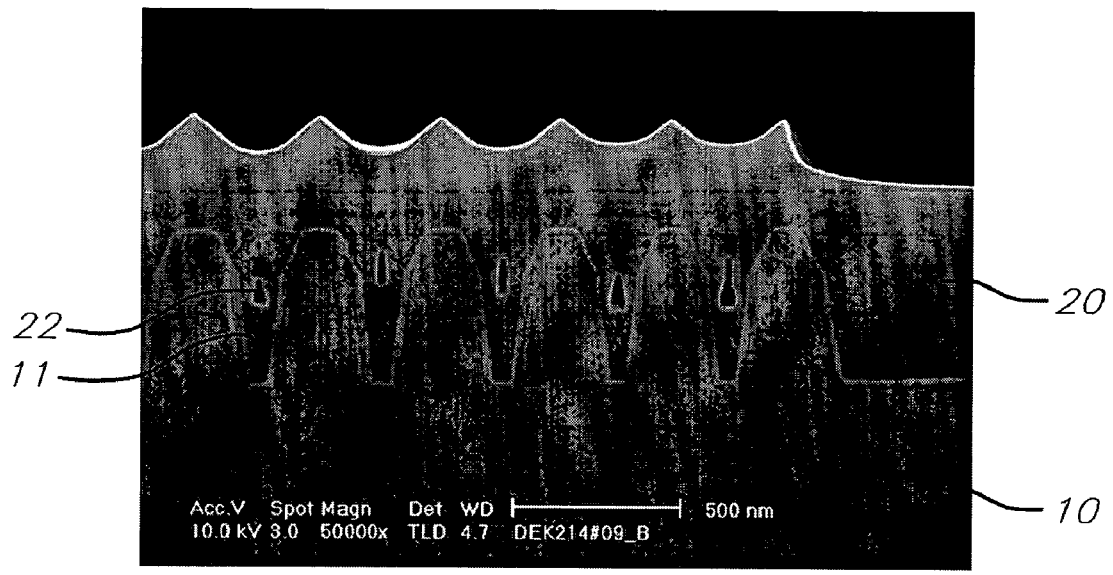
FIG. 4 shows a SEM cross section of trench filling in a HDP-CVD process that employs $O_2$.

As shown in FIG. 3, no void is observed in a trench having a width of 150 nm when D/S is 7.3, while voids are produced in a trench having a width of about (but just under) 150 nm when D/S is either 6.5 or 8.5. Further, when the trench width is smaller than 150 nm, voids 22 are produced even when D/S is 7.3 as shown in scanning electron microscope (SEM) photo of FIG. 4. That is to say, the limitation of the width of void-free trench when using $O_2$ alone as a sputter etchant is up to 150 nm.

Next, the trench filling features when the reactant gas mixture includes $SiH_4$, $O_2$, and He are explained.

The trench filling process may be carried out in two steps. In the first step (D1), the oxide is deposited at a higher D/S value, in which the deposition rate is (significantly) greater than the sputter etching rate. And then, a lower D/S in which the sputter etching rate may be greater than that in the first step, the deposition rate may be less than that in the first step, or both, is used to fill the trench in the second step (D2). During the second step, any overhang at the top of the trench side walls may be reduced or removed.

FIG. 5 illustrates the trench filling features (e.g., various parameters of the HDP CVD oxide deposition process) according to D/S when varying the D/S values in the first step (D1) and the second step (D2). In FIG. 5, D/R means the deposition rate (e.g., by HDP-CVD) and S/R means the sputter etching rate. As is shown in the tables, D/S in the first step may be greater than 10 (e.g., at least 12, at least about 13, from about 13 to 50, from about 13 to about 34, etc.), and in the second step, D/S may be 10 or less (e.g., no more than 10, 9.8 or less, from about 3 to 10, from about 5 to 9.8, etc.).

Figure 6:
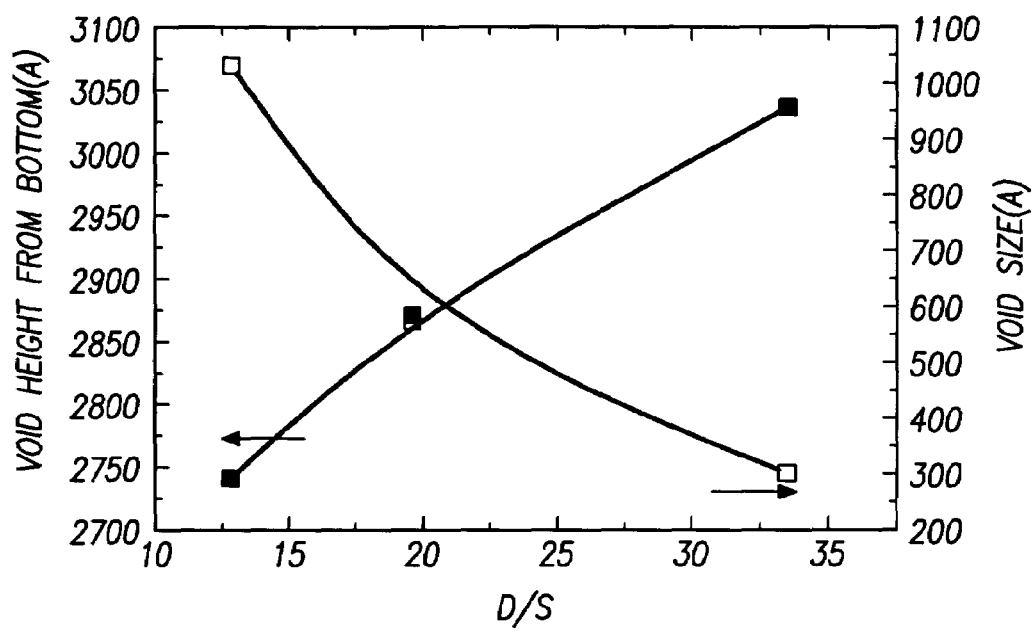
FIG. 6 is a graph for illustrating the dimension and position of voids in a trench according D/S in a HDP-CVD trench filling process that employs He.

FIG. 6 shows, following both steps of the two-step trench-filling process of the present invention, the dimensions and positions from the bottom surface of voids produced the trench in the first step (D1). In the exemplary process of FIG.

Figure 7:
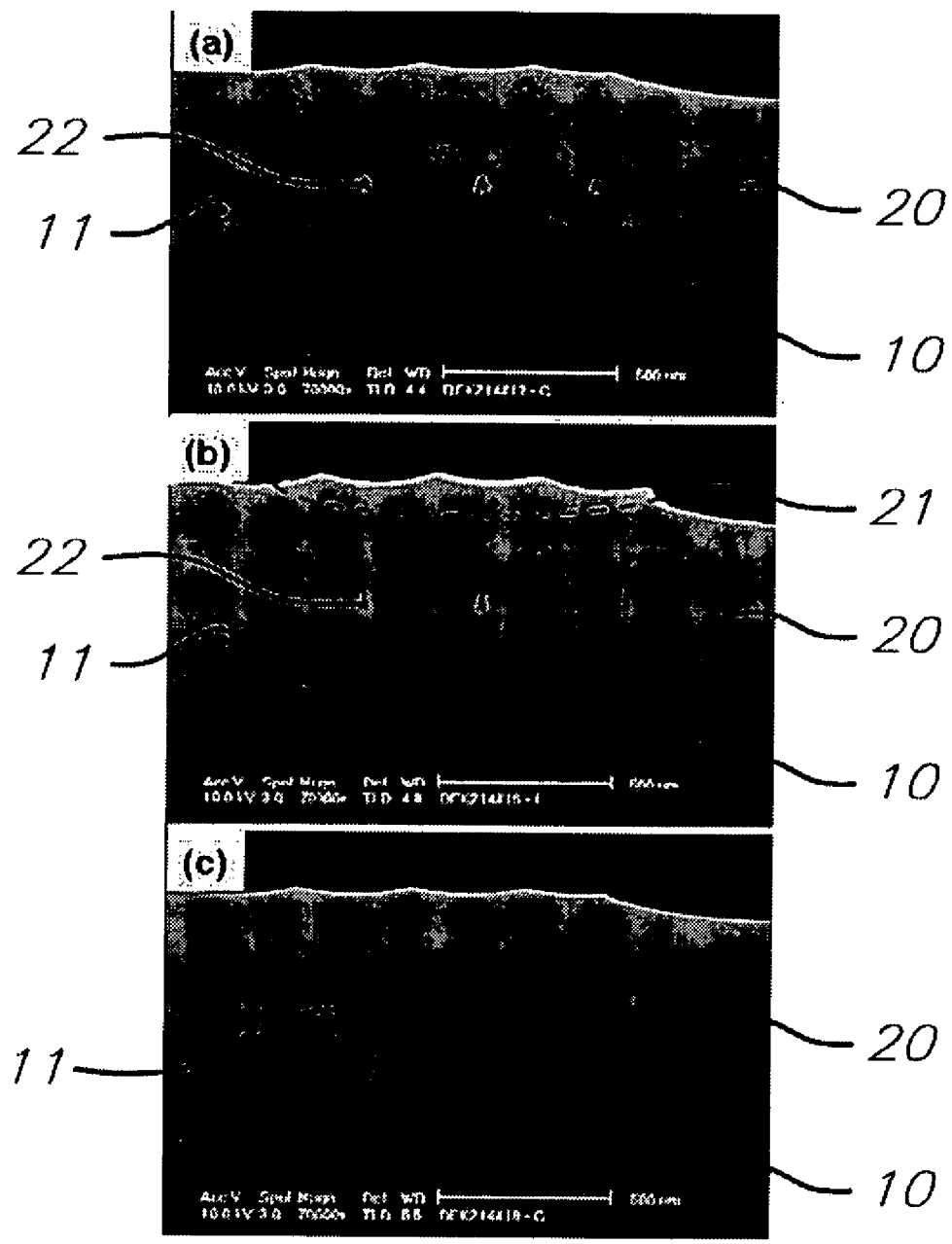
FIG. 7 is SEM photograph showing trench gap filling when D/S values are (a) 12.9, (b) 19.7 and (c) 33.6, respectively.

6, the second step (D2) starts with a fixed lower D/S value of 5.9 to remove the overhang that may have been produced in the first step (D1). As shown in FIG. 6, the void positions (■) are generally far from the bottom surface of the trench as the D/S value of the first step increases, while the size of the void (□) becomes smaller. The reason is that the trench filling goes fast before the overhang is produced during the deposition period (e.g., the first step) when the D/S is greater. It is confirmed from FIG. 7, which shows that as the D/S values used in the first step (D1) goes higher from (a) 12.9 to (b) 19.7, the voids 22 are produced less frequently, while no voids are observed at a higher D/S value of (c) 33.6.

Figure 8:
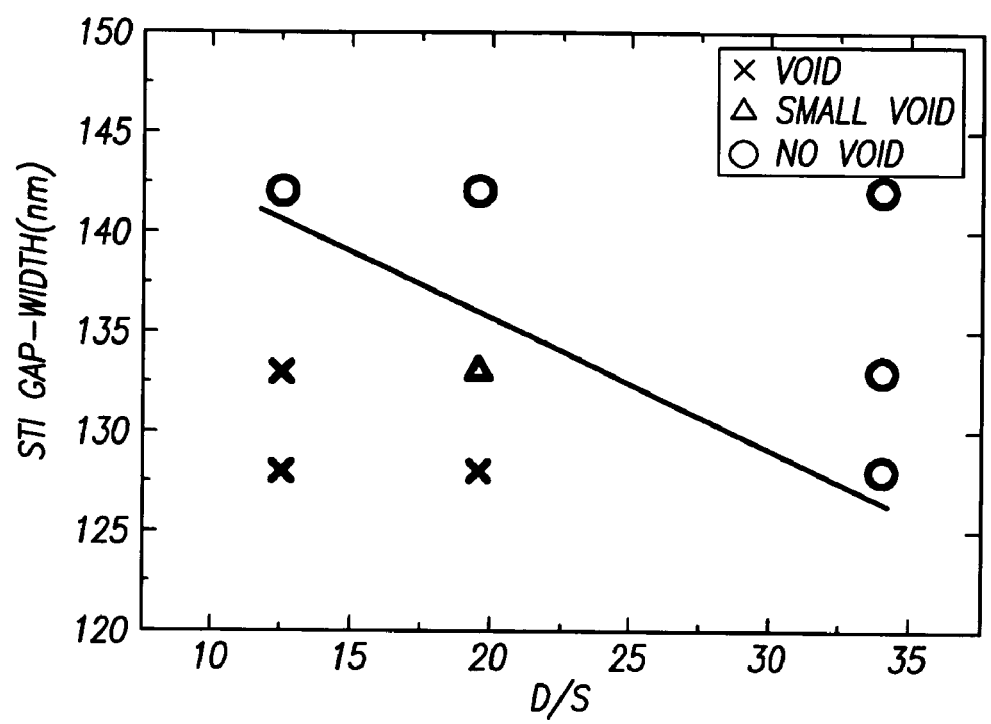
FIG. 8 is a graph for showing the trench filling ability according to D/S in a HDP-CVD process that employs He.

Dependence of trench filling capability upon the reactant gas mixture of $SiH_4$, $O_2$ and He is shown in FIG. 8. Void-free trench filling is possible up to the trench width of 140 nm (e.g., at a lower trench width limit of about 140 nm) with a lower D/S value of 10 to 20 in the first step (D1), and when the D/S value becomes greater than about 28 (e.g., $\geq$30, and in one embodiment, $\geq$33.6), no voids are produced even at a trench width of less than 130 nm.

As explained above, the comparison of trench filling capability between the conventional process that employs $SiH_4$ and $O_2$ as the reactant gas mixture and the process according to the present invention, which uses a gas mixture comprising $SiH_4$, $O_2$ and He, reveals the following. In the conventional process that employs only $O_2$ for the additional (e.g., sputter etching) gas, the minimum trench width for void-free trench having a depth of 370 nm is approximately 150 nm, and the (maximum) aspect ratio is 2.47. In contrast, with the process of the prevention invention which uses He as an additional sputter etching gas, it is possible to obtain void-free trench isolation structures at a trench width of 130 nm (and/or for a trench having an aspect ratio of up to 2.85) by controlling the D/S values in the first step (D1) and the second step (D2). This result is improvement by up to 15% from the conventional $O_2$ process.

Therefore, the present invention can ensure enough process margin for 130 nm level device in HDP-CVD process using He, which leads to saving of the cost for wafer re-work in photolithography, reduction or prevention of scrapping of wafers, and enhancements in productivity and yield of the semiconductor IC devices.

Further, the present invention makes it possible to form void-free isolation regions or layers (or at least reduce the adverse effects of voids in such regions or layers) by using He in HDP-CVD equipment.

While embodiments of the present invention has been particularly shown and described with reference to drawings, it will be understood by those of ordinary skilled in the art that various changes and modifications in form and details may be made without departing from the spirit and scope of the present invention as defined by the following claims.

What is claimed is:

1. A method for forming a trench isolation comprising the steps of:
    forming a trench in an isolation region in a semiconductor substrate; and
    filling the trench with an oxide by high density plasma chemical vapor deposition (HDP-CVD) using a reactant gas mixture that includes $O_2$, $SiH_4$ and He, wherein filling the trench includes depositing the oxide under first conditions such that a first D/S value has a greater deposition rate than a corresponding sputter etching rate; and
    depositing the oxide under second conditions such that a second D/S value is smaller than the first D/S value, wherein the D/S value is defined as (net deposition rate+blanket sputter etching rate)/(blanket sputter etching rate).

2. The method as claimed in claim 1, wherein the CVD deposition rate of the first and second conditions is controlled by the flow rate of $SiH_4$ and the rate of sputter etching is controlled by a bias power.

3. The method as claimed in claim 1, wherein the first D/S value is equal to or greater than 33.6.

4. The method as claimed in claim 1, further comprising, before the step of filling the trench with oxide, forming a silicon nitride in the trench and on the overall surface of the semiconductor substrate.

5. The method as claimed in claim 4, wherein forming the silicon nitride comprises low pressure chemical vapor deposition (LPCVD).

6. The method as claimed in claim 4, wherein the silicon nitride has a thickness of 20 nm.

7. The method as claimed in claim 5, wherein the silicon nitride has a thickness of 20 nm.

8. The method as claim in claim 1, wherein forming the oxide comprises introducing $SiH_4$ at a flow rate of approximately 50-90 sccm into a deposition chamber.

9. The method as claimed in claim 8, wherein the conditions further comprise introducing at flow rates of about 100-120 sccm of $O_2$ and about 50-150 sccm of He.

10. The method as claim in claim 1, wherein the oxide is formed under conditions comprising a flow rate of $SiH_4$ introduced to a side of a chamber of approximately 59 sccm, and a flow rate of $SiH_4$ introduced into a top of the chamber of approximately 8.1 sccm.

11. The method as claimed in claim 10, wherein the conditions further comprise flow rates of $O_2$ and He introduced to the side of the chamber of about 109 sccm of $O_2$ and about 100 sccm of He.

12. The method as claimed in claim 1, wherein the oxide is formed in a reaction chamber at a vacuum pressure of 3 mTorr and a semiconductor substrate temperature of 700° C.

13. The method as claimed in claim 12, wherein the oxide is formed at a bias power of from 1935 W to 2365 W.

14. The method as claimed in claim 1, wherein forming the oxide comprises depositing the oxide in a reaction chamber at a pressure of 0.5-10 mTorr.

15. The method as claimed in claim 14, wherein the oxide is deposited at a substrate temperature of 600-900° C.

16. The method as claimed in claim 15, wherein the oxide is deposited at a bias power of from 1800 W to 2500 W.

17. A method for forming a trench isolation comprising steps of:
    forming a trench in an isolation region in a semiconductor substrate;
    filling the trench with an oxide by high density plasma chemical vapor deposition (HDP-CVD) using a reactant gas mixture that includes $O_2$, $SiH_4$ and He, wherein filling the trench includes depositing a first part of the oxide at a first D/S value of greater than 10; and
    depositing a second part of the oxide at a second D/S value of 10 or less, wherein the D/S value equals (net deposition rate+sputter etching rate)/(sputter etching rate).

18. The method as claimed in claim 17, wherein the first D/S value is at least 28, and the second D/S value is less than 10.

19. The method as claimed in claim 17, wherein the first part of the oxide does not fill the trench, and the second part of the oxide is deposited in an amount sufficient to fill the trench.

* * * * *